US011842789B2

(12) United States Patent
Chen et al.

(10) Patent No.: US 11,842,789 B2
(45) Date of Patent: Dec. 12, 2023

(54) CAPACITOR STRING STRUCTURE, MEMORY DEVICE AND ELECTRONIC DEVICE

(71) Applicant: MACRONIX International Co., Ltd., Hsinchu (TW)

(72) Inventors: Chung-Kuang Chen, Hsinchu (TW); Tzeng-Huei Shiau, Hsin-Chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 30 days.

(21) Appl. No.: 17/709,174

(22) Filed: Mar. 30, 2022

(65) Prior Publication Data

US 2023/0317121 A1    Oct. 5, 2023

(51) Int. Cl.
*G11C 5/14* (2006.01)
*H01L 23/528* (2006.01)
*H01L 23/522* (2006.01)
*G11C 5/06* (2006.01)

(52) U.S. Cl.
CPC .............. *G11C 5/145* (2013.01); *G11C 5/063* (2013.01); *G11C 5/147* (2013.01); *H01L 23/528* (2013.01); *H01L 23/5223* (2013.01)

(58) Field of Classification Search
CPC ......... G11C 5/145; G11C 5/063; G11C 5/147; H01L 23/5223; H01L 23/528
USPC ............................................................ 365/72
See application file for complete search history.

(56) References Cited

U.S. PATENT DOCUMENTS

| 7,408,807 | B2 | 8/2008 | Roohparvar |
| 9,716,137 | B1 | 7/2017 | Hu et al. |
| 10,388,720 | B2 | 8/2019 | Lue et al. |
| 2017/0069567 | A1* | 3/2017 | Chen ............... H10B 43/35 |
| 2023/0198386 | A1* | 6/2023 | Rana ............... H02M 3/07 |
| | | | 327/536 |

OTHER PUBLICATIONS

"Office Action of Taiwan Counterpart Application", dated Dec. 13, 2022, p. 1-p. 6.

* cited by examiner

*Primary Examiner* — Fernando Hidalgo
(74) *Attorney, Agent, or Firm* — J.C. PATENTS

(57) ABSTRACT

A capacitor string structure, a memory device and a charge pump circuit thereof are provided. The capacitor string structure includes a plurality of conductive plates. The conductive plates are disposed in the memory device. The conductive plates are stacked to each other, and respectively form a plurality of word lines of the memory device, where two neighbored conductive plates form a capacitor.

15 Claims, 9 Drawing Sheets

CAPACITOR STRING STRUCTURE, MEMORY DEVICE AND ELECTRONIC DEVICE

BACKGROUND

Technical Field

The disclosure relates to a capacitor string structure, a memory device, and an electronic device thereof, and more particularly to a capacitor string structure formed on a word line of a memory device, and an electronic device constructed based on a capacitor structure.

Description of Related Art

In the memory technology field, disposing a charge pump circuit in a memory device is a necessary choice. The charge pump circuit may be configured to increase a word line voltage on a word line to activate a programmed action of a memory cell.

The charge pump circuit needs a plurality of corresponding capacitors to be disposed. Moreover, the capacitors need to consume a large amount of layout area in the layout of an integrated circuit. Therefore, how to save the layout area of the capacitors in the integrated circuit is an important issue for those skilled in the art.

SUMMARY

The disclosure provides a capacitor string structure formed by using a plurality of word lines in a memory device, and the area required for circuit layout may be reduced.

The disclosure provides a memory device and an electronic device thereof combined with the above-mentioned capacitor string structure, and the area required for circuit layout may be reduced.

The capacitor string structure of the disclosure includes a plurality of conductive plates. The conductive plates are disposed in the memory device. The conductive plates are stacked on each other to respectively form a plurality of word lines in the memory device, and a capacitor is formed between two adjacent ones of the conductive plates.

The electronic device of the disclosure includes a core circuit and a plurality of first capacitors. The core circuit is coupled to the first capacitors. The first capacitors form a capacitor string structure. The capacitor string structure is formed by a plurality of conductive plates. The conductive plates are disposed in the memory device. The conductive plates are stacked on each other to respectively form a plurality of word lines in the memory device, and the first capacitors are respectively formed between two adjacent ones of the conductive plates.

The memory device of the disclosure includes a plurality of word lines and a charge pump circuit. Each of the word lines is coupled to a plurality of memory cells. The word lines are respectively formed by a plurality of conductive plates, and the conductive plates form a capacitor string structure. The charge pump circuit is coupled to the capacitor string structure, and performs a charge pump operation on a plurality of first capacitors in the capacitor structure according to a plurality of clock signals to generate an output voltage.

Based on the above, the capacitor string structure of the disclosure is formed by a plurality of word lines stacked on each other in a memory device. The capacitor string structure of the disclosure may be used in a memory device and an electronic device as mediums for charge storage and transfer. Since the capacitor string structure is formed through the plurality of word lines stacked on each other in the memory device, the capacitor string structure does not need to occupy additional circuit layout area, and thus the circuit cost may be effectively reduced.

DESCRIPTION OF THE EMBODIMENTS

Figure 1:
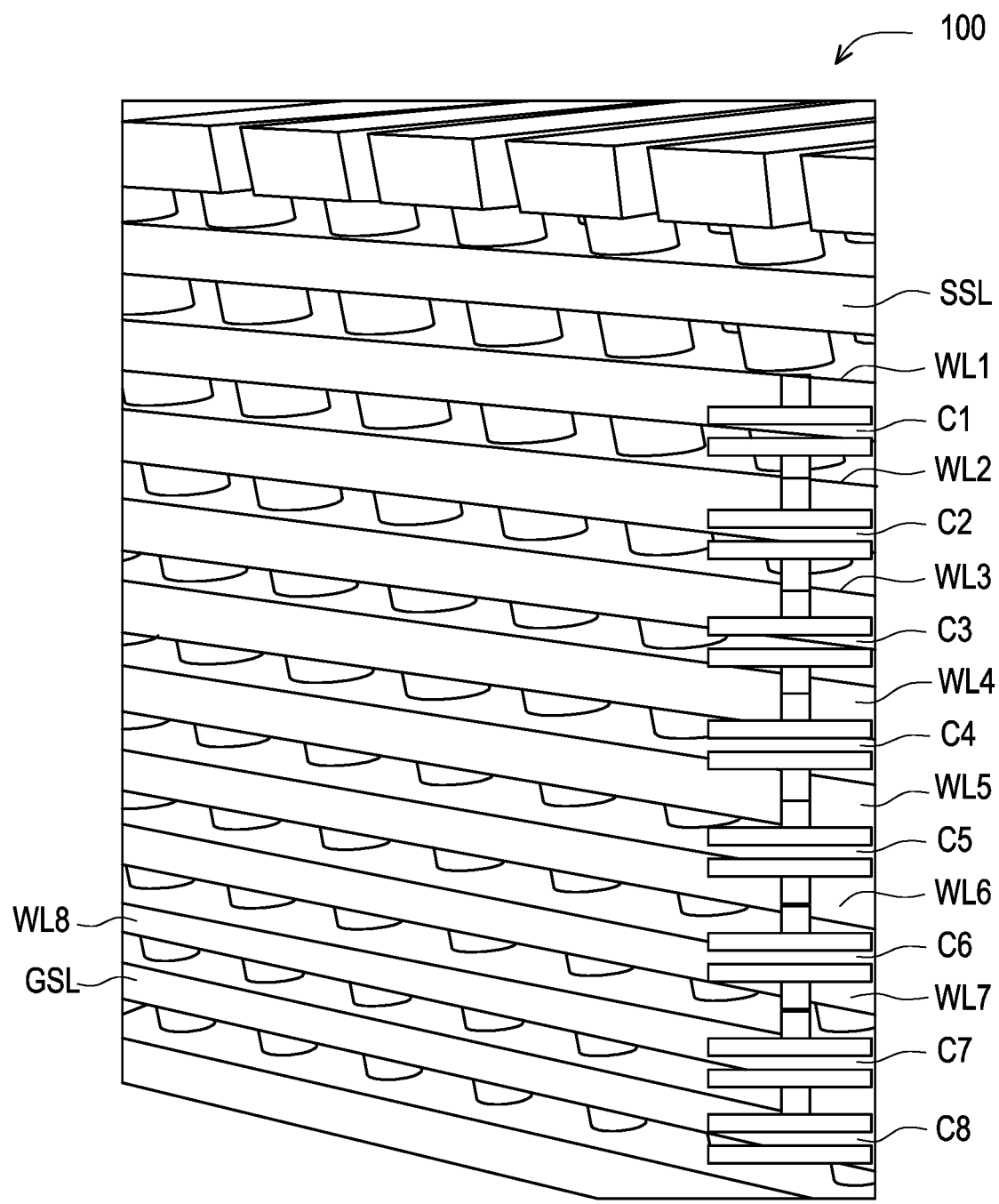
FIG. 1 is a schematic diagram of a capacitor string structure according to an embodiment of the disclosure.

Please refer to FIG. 1. FIG. 1 is a schematic diagram of a capacitor string structure according to an embodiment of the disclosure. The capacitor string structure includes capacitors C1 to C8 coupled in series. The capacitors C1 to C8 are formed by a plurality of conductive plates forming word lines WL1 to WL8 of a memory device 100. In the embodiment, the conductive plates forming the word lines WL1 to WL8 are sequentially stacked. The two conductive plates of adjacent word lines WL1 and WL2 form a capacitor C1; the two conductive plates of adjacent word lines WL2 and WL3 form a capacitor C2; . . . ; the two conductive plates of adjacent word lines WL7 and WL8 form a capacitor C8.

In the embodiment, the memory device 100 may be a non-volatile memory (such as a flash memory) or a volatile memory, without specific limitation.

In the embodiment, the memory device 100 is a memory device with a three-dimensional structure. The memory device 100 has conductive plates forming a string selection line SSL and a common source line GSL. The conductive plates forming the word lines WL1 to WL8 are sequentially disposed between the two conductive plates of the string selection line SSL and the common source line GSL. It is worth mentioning that the embodiment of the disclosure uses the conductive plates forming the word lines WL1 to WL8 in the memory device 100 to form a capacitor string structure including the capacitors C1 to C8, and capacitance required in a circuit may be generated without a requirement of additional layout area.

It is worth mentioning that in the memory device 100, the conductive plates forming the word lines WL1 to WL8 may be conductive plates with string holes or conductive plates without string holes. In the embodiment of the disclosure, the conductive plates configured to form the word lines WL1 to WL8 may be conductive plates without string holes, or may also be conductive plates with string holes, without fixed limitation.

Figure 2:
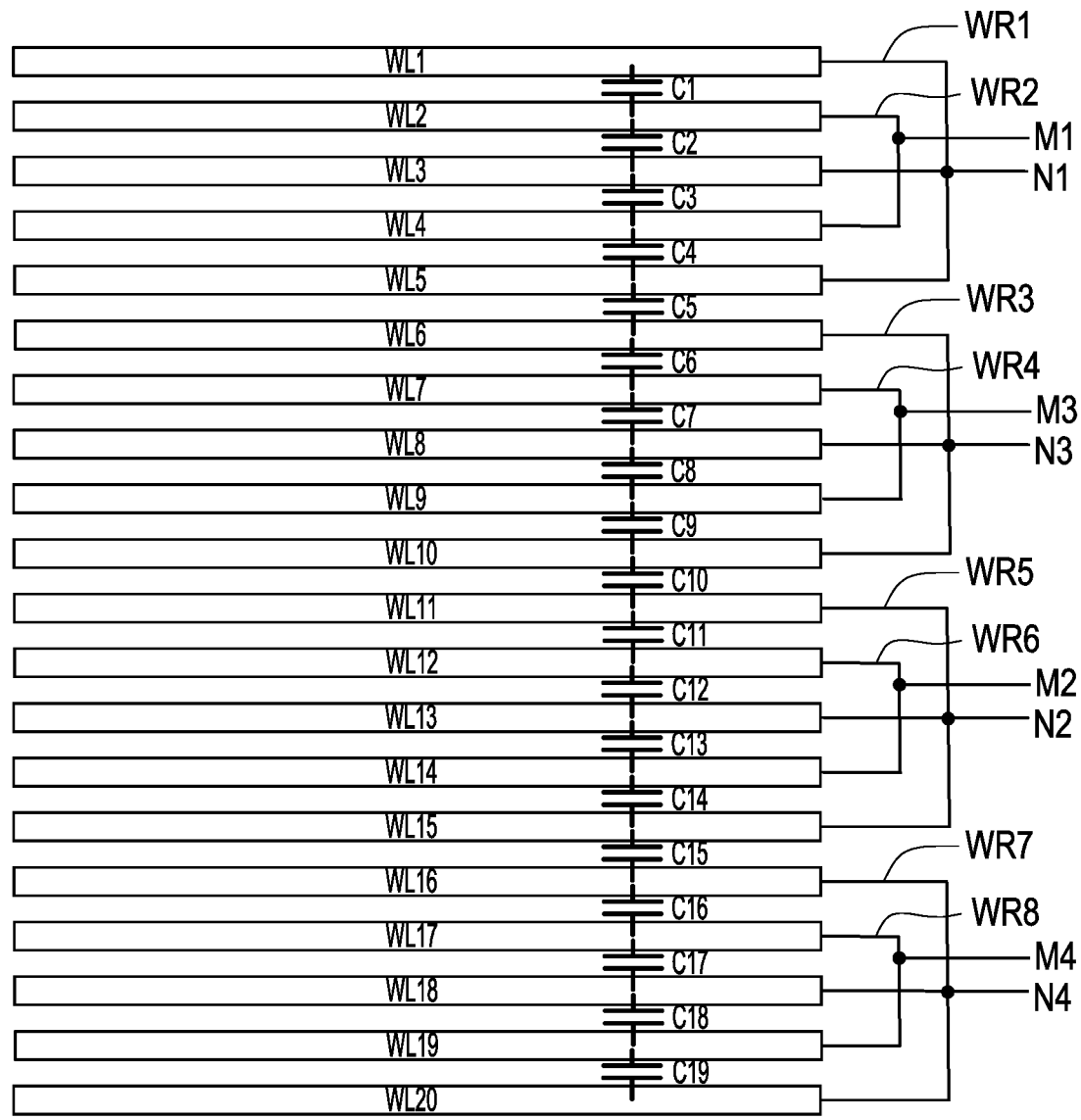
FIG. 2 is a schematic diagram of a capacitor string structure according to an embodiment of the disclosure.

Please refer to FIG. 2 for the following. FIG. 2 is a schematic diagram of a capacitor string structure according to an embodiment of the disclosure. The capacitor string structure 200 is formed by a plurality of conductive plates forming word lines WL1 to WL20. Among the word lines WL1 to WL20, two adjacent conductive plates form capacitors C1 to C19, respectively. In the embodiment, first conductive plates forming the word lines WL1, WL3, and WL5 may be mutually coupled to a terminal N1 through a transmission wire WR1, and second conductive plates forming the word lines WL2 and WL4 may be mutually coupled to a terminal M1 through a transmission wire WR2. In this way, the capacitors C1 to C4 may be coupled in parallel between the terminals N1 and M1.

In addition, first conductive plates forming the word lines WL6, WL8, and WL10 may be mutually coupled to a terminal N3 through a transmission wire WR3; second conductive plates forming the word lines WL7 and WL9 may be mutually coupled to a terminal M3 through a transmission wire WR4; first conductive plates forming the word lines WL11, WL13, and WL15 may be mutually coupled to a terminal N2 through a transmission wire WR5; second conductive plates forming the word lines WL12 and WL14 may be mutually coupled to a terminal M2 through a transmission wire WR6; first conductive plates forming the word lines WL16, WL18, and WL20 may be mutually coupled to a terminal N4 through a transmission wire WR7; second conductive plates forming the word lines WL17 and WL19 may be mutually coupled to a terminal M4 through a transmission wire WR8. The aforementioned plurality of first conductive plates are not directly adjacent to each other, and the plurality of second conductive plates are also not directly adjacent to each other.

Through the above coupling relationships, the capacitors C6 to C10 may be coupled in parallel between the terminals M3 and N3, the capacitors C11 to C14 may be coupled in parallel between the terminals M2 and N2, and the capacitors C15 to C19 may be coupled in parallel between the terminals M4 and N4. Moreover, the capacitors between the above-mentioned terminals M1 and N1, the capacitors between the terminals M3 and N3, the capacitors between the terminals M2 and N2, and the capacitors between the terminals M4 and N4 are sequentially coupled in series.

Incidentally, the number of word lines WL1 to WL20 in the embodiment is only an example for illustration, and is not intended to limit the scope of the disclosure. Those of ordinary skill in the art may generate different numbers of capacitors according to the actual number of word lines in a memory device, without specific limitation.

In addition, in the embodiment, the number of capacitors connected in parallel between any two terminals may be adjusted according to design requirements, and is not limited to four as described in the embodiment. By adjusting the number of capacitors connected in parallel between the two terminals, the size of the equivalent capacitance provided between the two terminals may be adjusted.

Figure 3A:
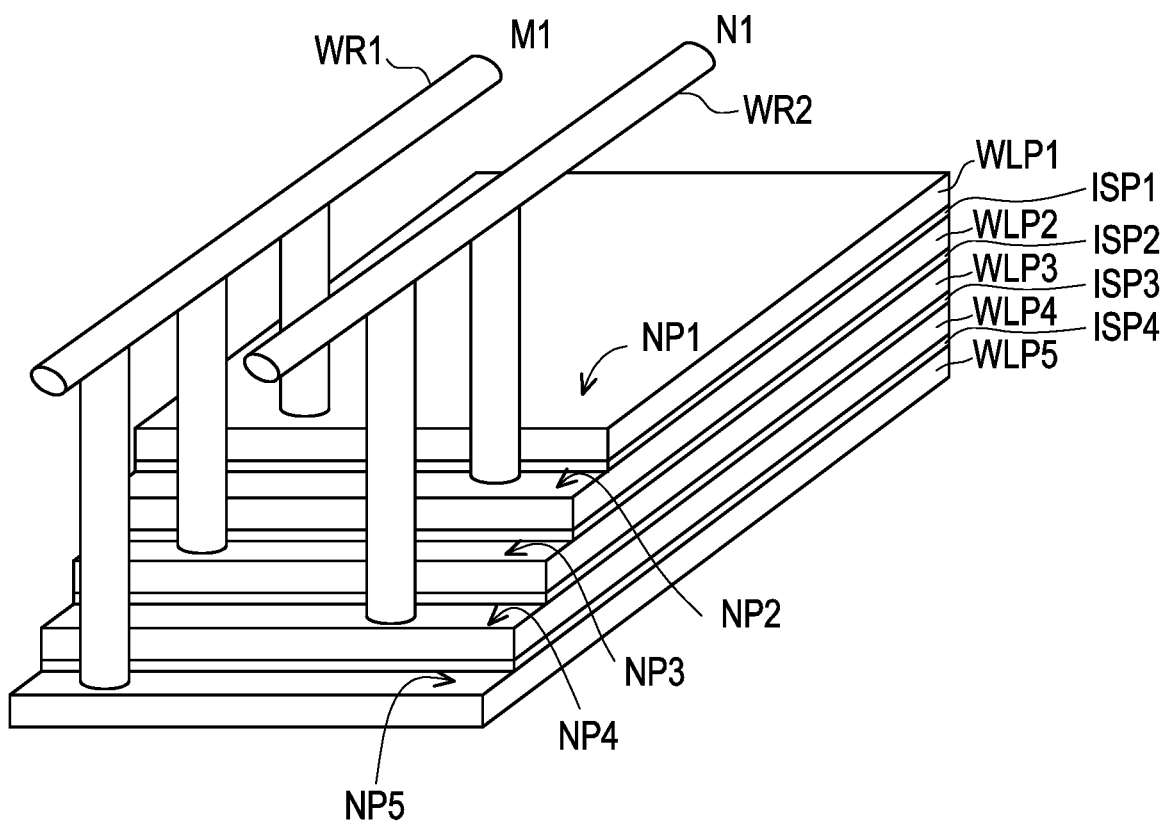
FIG. 3A to FIG. 3C show schematic diagrams of different implementations of a capacitor string structure, respectively, according to embodiments of the disclosure.
Figure 3B:
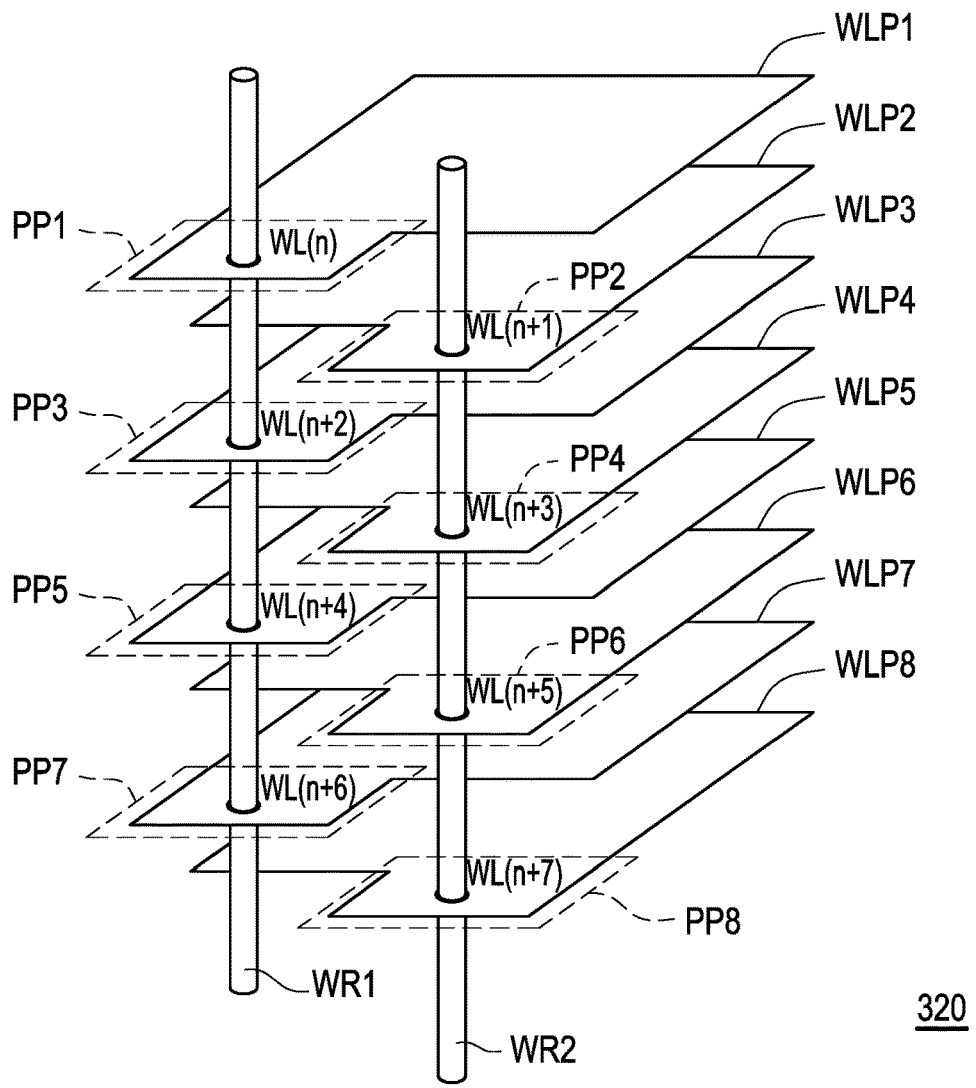
Figure 3C:
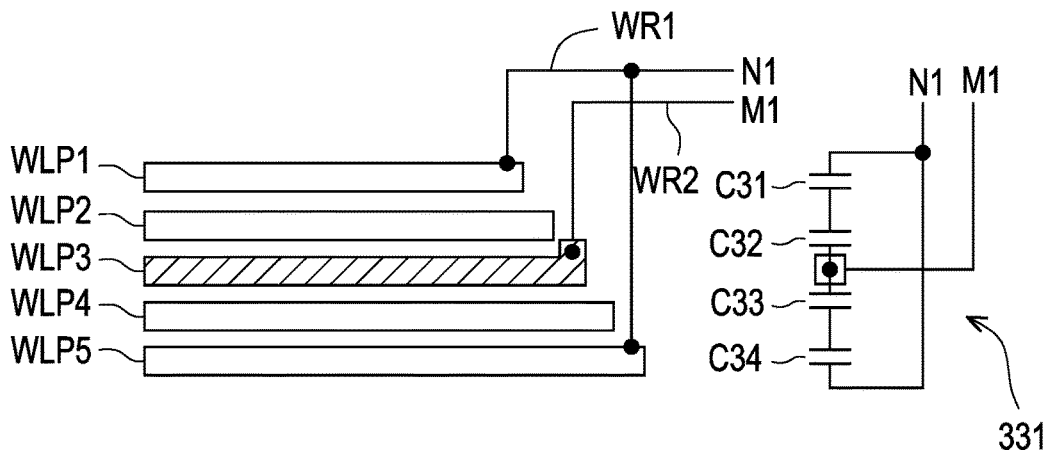

Please refer to FIG. 3A to FIG. 3C for the following. FIG. 3A to FIG. 3C are, respectively, schematic diagrams of different implementations of a capacitor string structure according to embodiments of the disclosure. In FIG. 3A, a capacitor string structure 310 includes a plurality of conductive plates WLP1 to WLP5 forming word lines of a memory device and a plurality of dielectric layers ISP1 to ISP4. The conductive plates WLP1 to WLP5 are alternately arranged with the dielectric layers ISP1 to IP4. Moreover, capacitors may be formed, respectively, between the conductive plates WLP1 and WLP2, between the conductive plates WLP2 and WLP3, between the conductive plates WLP3 and WLP4, and between the conductive plates WLP4 and WLP5. In the embodiment, the conductive plates WLP1 to WLP5 are stacked on each other in a stepped shape, and the conductive plates WLP1 to WLP5 have respective exposed portions NP1 to NP5.

In addition, the capacitor string structure 310 further includes transmission wires WR1 and WR2. The transmission wire WR1 is coupled to the exposed portions NP1, NP3, and NP5 of the conductive plates WLP1, WLP3, and WLP5, respectively. The transmission wire WR1 may further be coupled to a terminal M1. The transmission wire WR2 is coupled to the exposed portions NP2 and NP4 of the conductive plates WLP2 and WLP4, respectively. The transmission wire WR2 may further be coupled to a terminal N1. Through the transmission wires WR1 and WR2, the capacitors formed between the conductive plates WLP1 to WLP5 may be coupled in parallel between the terminals M1 and N1.

In FIG. 3B, a capacitor string structure 320 includes conductive plates WLP1 to WLP8. The conductive plates WLP1 to WLP8 are, respectively, configured to form word lines WL(n) to WL(n+7) in a memory device. The conductive plates WLP1 to WLP8 are arranged to overlap each other, and a plurality of capacitors are respectively formed between two adjacent conductive plates WLP1 to WLP8. The conductive plates WLP1, WLP3, WLP5, and WLP7 have overlapping protrusions PP1, PP3, PP5, and PP7, respectively, and the conductive plates WLP2, WLP4, WLP6, and WLP8 have overlapping protrusions PP2, PP4, PP6, and PP8, respectively. Each of the protrusions PP1, PP3, PP5, and PP7 is not overlapped with each of the protrusions PP2, PP4, PP6, and PP8. The capacitor string structure 320 further includes transmission wires WR1 and WR2. The transmission wire WR1 is coupled to the protrusions PP1, PP3, PP5, and PP7, and the transmission wire WR2 is coupled to the protrusions PP2, PP4, PP6, and PP8. The plurality of capacitors formed between the conductive plates WLP1 to WLP7 may be coupled in parallel with each other.

In FIG. 3C, a capacitor string structure 330 includes a plurality of conductive plates WLP1 to WLP5 forming word lines of a memory device. The conductive plates WLP1 to WLP5 may be stacked on each other in a stepped shape. In the embodiment, a transmission wire WR1 is coupled to the conductive plate WLP1 and the conductive plate WLP5, and is not directly connected to the conductive plates WLP2 and WLP4 (third conductive plates).

Moreover, a transmission wire WR2 is coupled to the conductive plate WLP3 to form an equivalent circuit 331. The transmission wire WR1 is further coupled to a terminal N1, and the transmission wire WR2 is further coupled to a terminal M1.

In the equivalent circuit 331, an equivalent capacitor C31 formed between the conductive plates WLP1 and WLP2 and an equivalent capacitor C32 formed between the conductive plates WLP2 and WLP3 are mutually coupled in series between the terminals N1 and M1. An equivalent capacitor C33 formed between the conductive plates WLP3 and WLP4 and an equivalent capacitor C34 formed between the conductive plates WLP4 and WLP5 are mutually coupled in series between the terminals M1 and N1.

Through the coupling configuration of the implementation in FIG. 3C, relatively many capacitors mutually connected in series may be provided between the terminals N1 and M1. Thus, the voltage withstand capability between the terminals N1 and M1 may be improved.

Certainly, the implementation in FIG. 3C in which two capacitors mutually connected in series are provided between the two terminals N1 and M1 is merely an example for illustration. The designer may further arrange three or more capacitors mutually connected in series between the two terminals N1 and M1. The number of capacitors connected in series between the two terminals N1 and M1 may be determined by the designer, without specific limitation.

Figure 4:
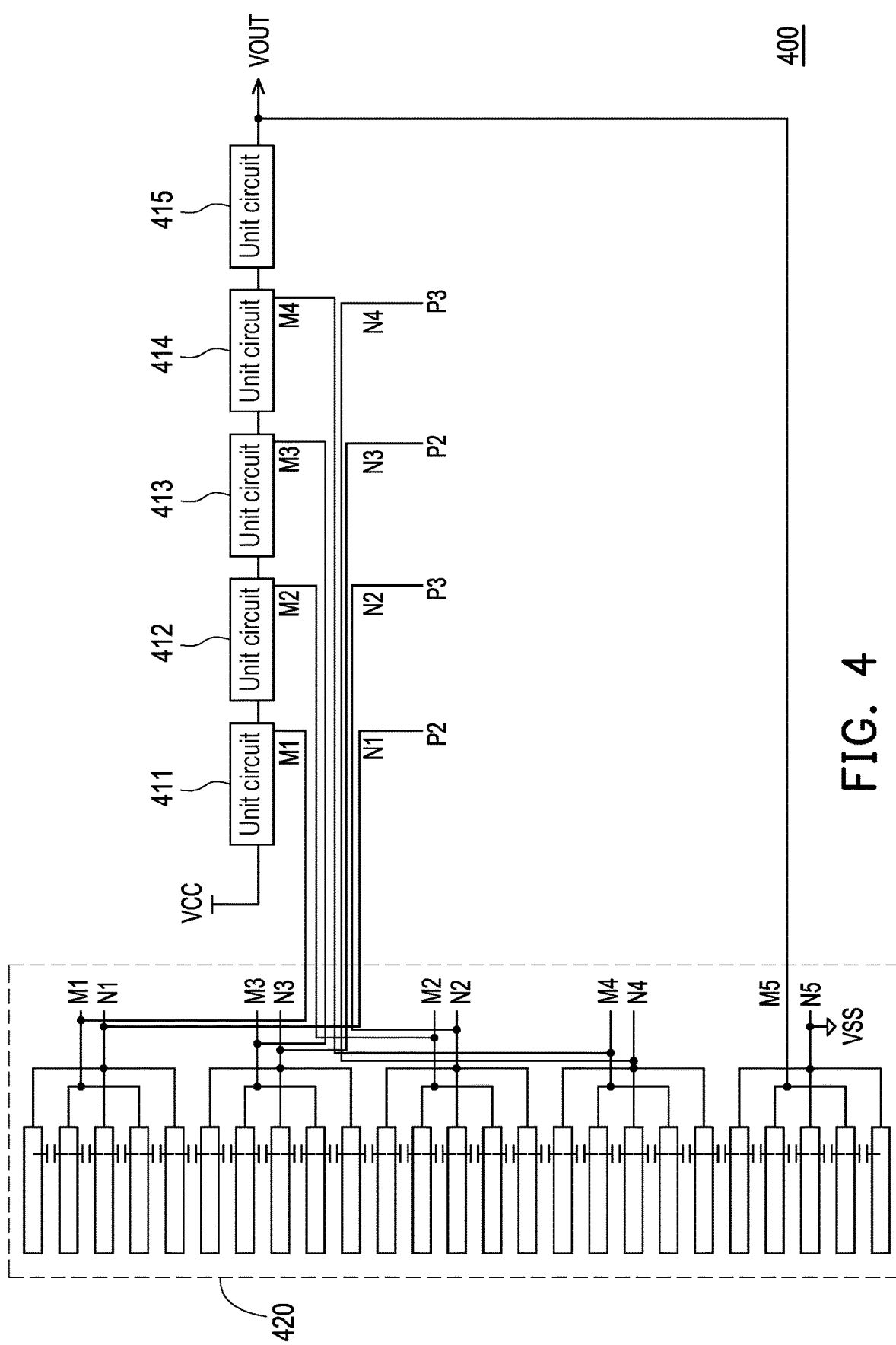
FIG. 4 is a schematic diagram of an electronic device according to an embodiment of the disclosure.

Please refer to FIG. 4 for the following. FIG. 4 is a schematic diagram of an electronic device according to an embodiment of the disclosure, where the electronic device may be a charge pump circuit 400. The charge pump circuit 400 includes a core circuit including a plurality of unit circuits 411 to 415, and a capacitor string structure 420 formed by capacitors between conductive plates of a plurality of word lines WL. The unit circuits 411 to 415 are sequentially coupled in series, and the unit circuit 411 of the first stage receives a reference voltage VCC. Output terminals of the unit circuits 411 to 415 are coupled to terminals M1 to M5, respectively. The terminal M5 may be the output terminal of the charge pump circuit 400 and generates an output voltage VOUT. The output terminals of the unit circuits 411 to 414 are coupled to input terminals of the unit circuits 412 to 415 of the next stage, respectively.

In the capacitor string structure 420, the other terminals N1 and N3 of a plurality of capacitors are configured to receive a clock signal P2; terminals N2 and N4 are configured to receive a clock signal P3; and a terminal N5 is coupled to a reference ground terminal VSS. The clock signal P3 and the clock signal P2 may have different phases. The clock signal P3 and the clock signal P2 alternately instruct the terminals N1 to N4 of the corresponding connected capacitors to alternately switch between different first voltage and second voltage.

Corresponding to the voltage alternate switching actions of the plurality of capacitors in the capacitor string structure 420, the unit circuits 411 to 415 may perform charge transfer actions. The charge pump circuit 400 may generate an output voltage VOUT several times the reference voltage VCC through a voltage pumping action based on the reference voltage VCC.

It is worth mentioning that in the embodiment, the unit circuits 411 to 415 may be implemented using charge pump unit circuits in a multi-stage charge pump circuit known to those of ordinary skill in the art, without fixed limitation.

The implementation details of the capacitor string structure 420 have been described in detail in the foregoing plurality of embodiments and implementations, and thus are not repeated here.

Figure 5A:
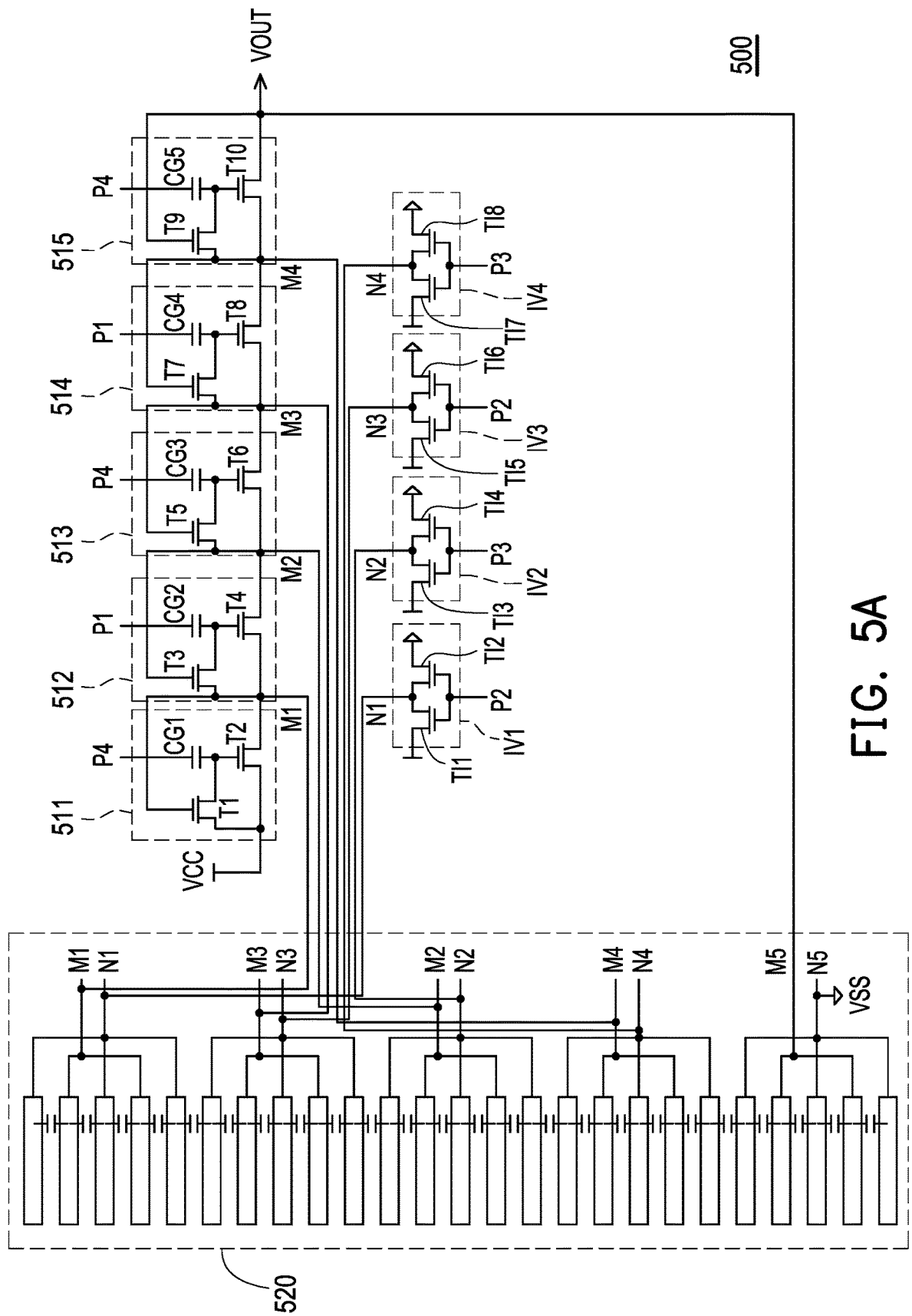
FIG. 5A to FIG. 5E are schematic diagrams of electronic devices according to embodiments of the disclosure.

Please refer to FIG. 5A to FIG. 5E for the following. FIG. 5A to FIG. 5E are schematic diagrams of electronic devices according to embodiments of the disclosure. In FIG. 5A, the electronic device is a charge pump circuit 500. The charge pump circuit 500 includes a core circuit including a plurality of unit circuits 511 to 515 and a plurality of inverters IV1 to IV4, and a capacitor string structure 520 formed by capacitors between conductive plates of a plurality of word lines WL. In the embodiment, the unit circuit 511 includes transistors T1 and T2 and a capacitor CG1; the unit circuit 512 includes transistors T3 and T4 and a capacitor CG2; the unit circuit 513 includes transistors T5 and T6 and a capacitor CG3; the unit circuit 514 includes transistors T7 and T8 and a capacitor CG4; the unit circuit 515 includes transistors T9 and T10 and a capacitor CG5. In the unit circuit 511 of the first stage, the first terminal of the transistor T1 receives a reference voltage VCC, and the control terminal of the transistor T1 is coupled to the output terminal of the unit circuit 511 and coupled to a terminal M1. The second terminal of the transistor T1 is coupled to the control terminal of the transistor T2. The first terminal of the transistor T2 is coupled to the first terminal of the transistor T1, and the second terminal of the transistor T2 is coupled to the control terminal of the transistor T1. In addition, one terminal of the capacitor CG1 receives a clock signal P4, and the other terminal of the capacitor CG1 is coupled to the control terminal of the transistor T2. In the unit circuits 512 to 515 from the second stage to the last stage, the first terminals of the transistors T3, T5, T7, and T9 are coupled to the output terminals of the previous-stage unit circuits 511 to 514, and the output terminal of the last-stage unit circuit 515 is configured to generate an output voltage VOUT. In the unit circuits 512 to 515 from the second stage to the last stage, the capacitors CG2 and CG4 receive a clock signal P1, and the capacitors CG3 and CG5 receive the clock signal P4.

In addition, the inverter IV1 is formed by connecting transistors TI1 and 112 in series; the inverter IV2 is formed by connecting transistors 113 and 114 in series; the inverter IV3 is formed by connecting transistors TI5 and 116 in series; and, the inverter IV4 is formed by connecting transistors 117 and 118 in series. The inverter IV1 receives a clock signal P2 and provides a reverse signal of the clock signal P2 to a terminal N1; the inverter IV2 receives a clock signal P3 and provides a reverse signal of the clock signal P3 to a terminal N2; the inverter IV3 receives the clock signal P2 and provides a reverse signal of the clock signal P2 to a terminal N3; the inverter IV4 receives the clock signal P3 and provides a reverse signal of the clock signal P3 to a terminal N4. The clock signals P1 to P4 respectively have different phases.

In the embodiment, the transistors T1 to T10 and the transistors TI2, TI4, TI6, and TI8 may all be N-type transistors. The transistors TI1, TI3, TI5, and TI7 may be P-type transistors.

Figure 5B:
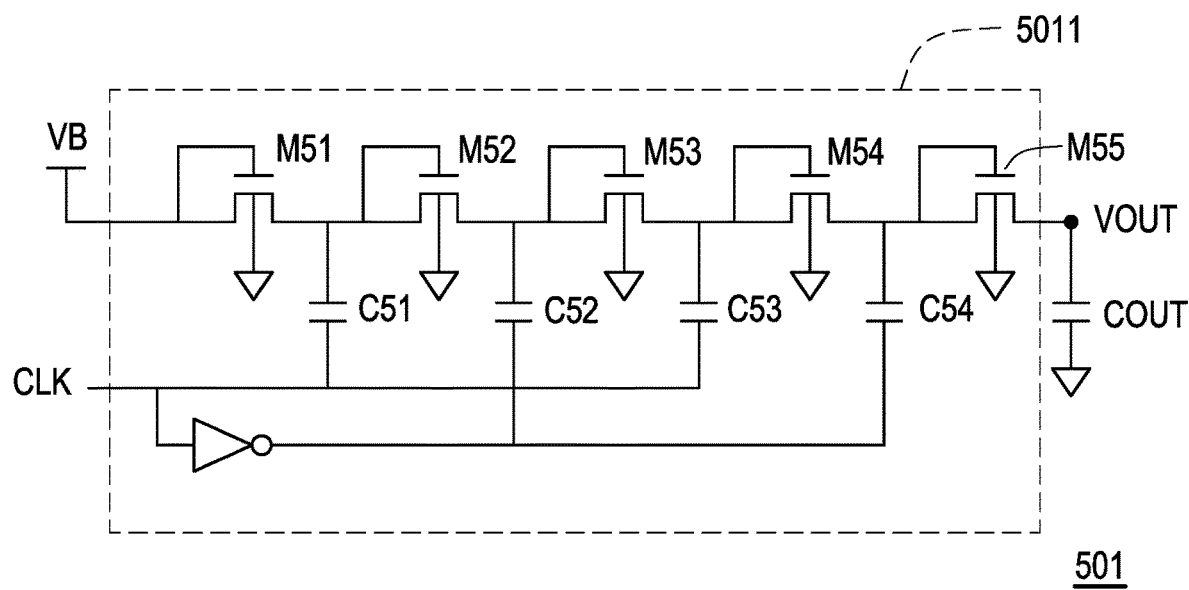

In FIG. 5B, the electronic device is a two-phase charge pump circuit 501. The two-phase charge pump circuit 501 includes a core circuit 5011 and a capacitor COUT, where the capacitor COUT is a capacitor string structure formed by a plurality of conductive plates forming a word line of a memory device. The capacitor COUT is coupled to an output end of the core circuit 5011. Detail of the capacitor string structure can be seen by the capacitor string structure 520 in FIG. 5A. The core circuit 5011 includes a plurality of transistors M51~M55 coupled in series. Each of the transistors M51~M55 coupled in a diode configuration. The transistors M51 receives a base voltage VB, the transistors M52 and M54 receive a clock signal CLK through capacitors C51 and C53, and the transistors M53 and M55 receive an inverted clock signal through capacitors C52 and C54. The core circuit 5011 pumps up the base voltage VB to generate an output voltage VOUT at the output end of the core circuit 5011.

Figure 5C:
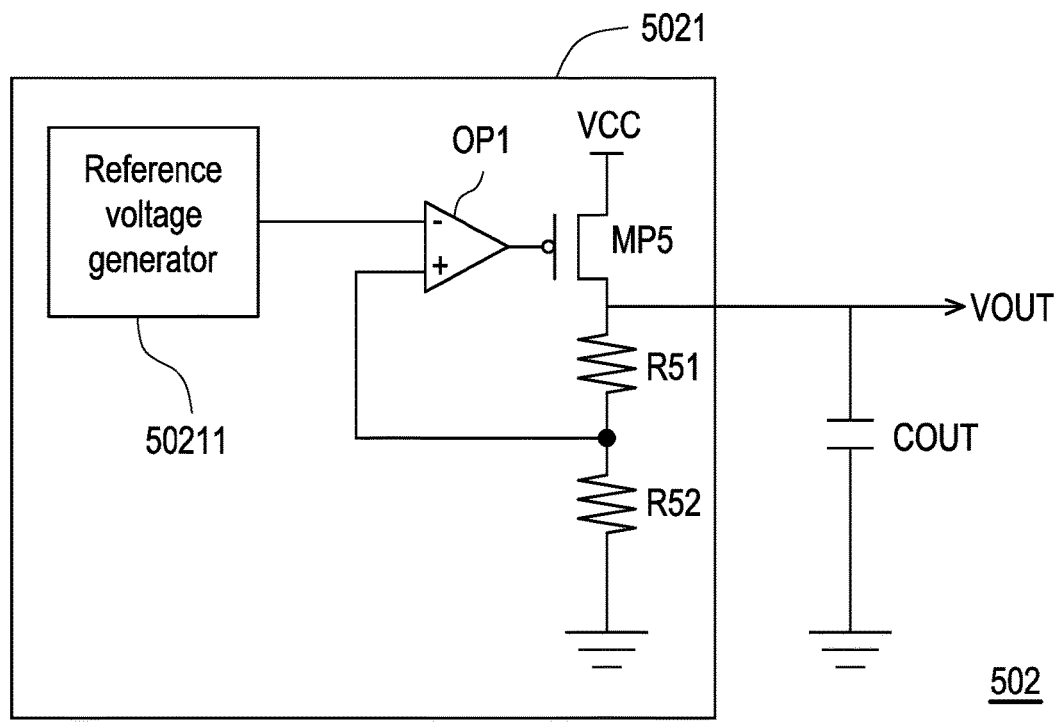

In FIG. 5C, the electronic device is a voltage regulator 502. The voltage regulator 502 includes a core circuit 5021 and a capacitor COUT, where the capacitor COUT is a capacitor string structure formed by a plurality of conductive plates forming a word line of a memory device. The capacitor COUT is coupled to an output end of the core circuit 5021. Detail of the capacitor string structure can be seen by the capacitor string structure 520 in FIG. 5A. The core circuit 5021 includes a reference voltage generator 50211, an amplifier OP1, a power transistor MP5 and resistors R51 and R52. The reference voltage generator 50211 may be a bandgap voltage generator to provide a reference voltage to the amplifier OP1. The resistors R51 and R52 provide a feedback voltage to the amplifier OP1 by dividing an output voltage VOUT. The voltage regulator 502 is a low drop-out voltage regulator.

Figure 5D:
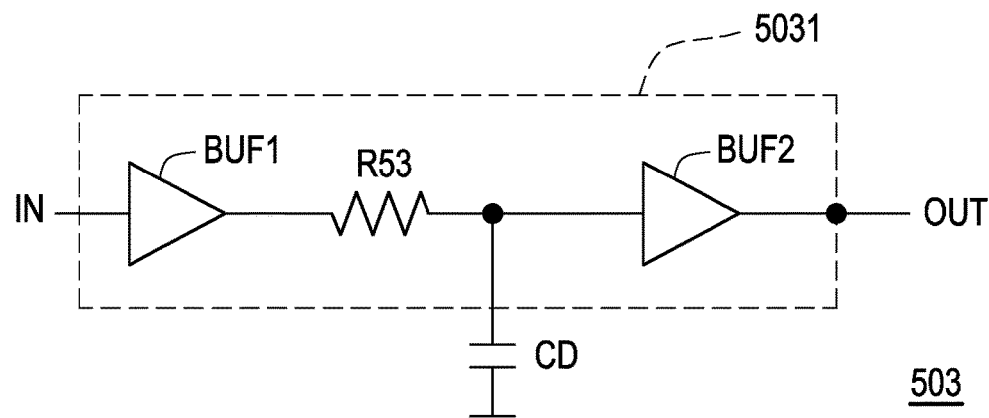

In FIG. 5D, the electronic device is a timing delay circuit 503. The timing delay circuit 503 includes a core circuit 5031 and a capacitor CD, where the capacitor CD is a capacitor string structure formed by a plurality of conductive plates forming a word line of a memory device. Detail of the capacitor string structure can be seen by the capacitor string structure 520 in FIG. 5A. The core circuit 5031 includes buffers BUF1 and BUF2 and a resistor R53. The buffers BUF1 and BUF2 are coupled in series for deceiving an input signal IN and generating an output signal OUT by delaying the input signal IN. The resistor R53 is coupled between the buffers BUF1 and BUF2, and the capacitor CD is coupled between the resistor R53 and a ground end. A delay time of the timing delay circuit 503 can be determined by the resistor R53 and the capacitor CD.

Figure 5E:
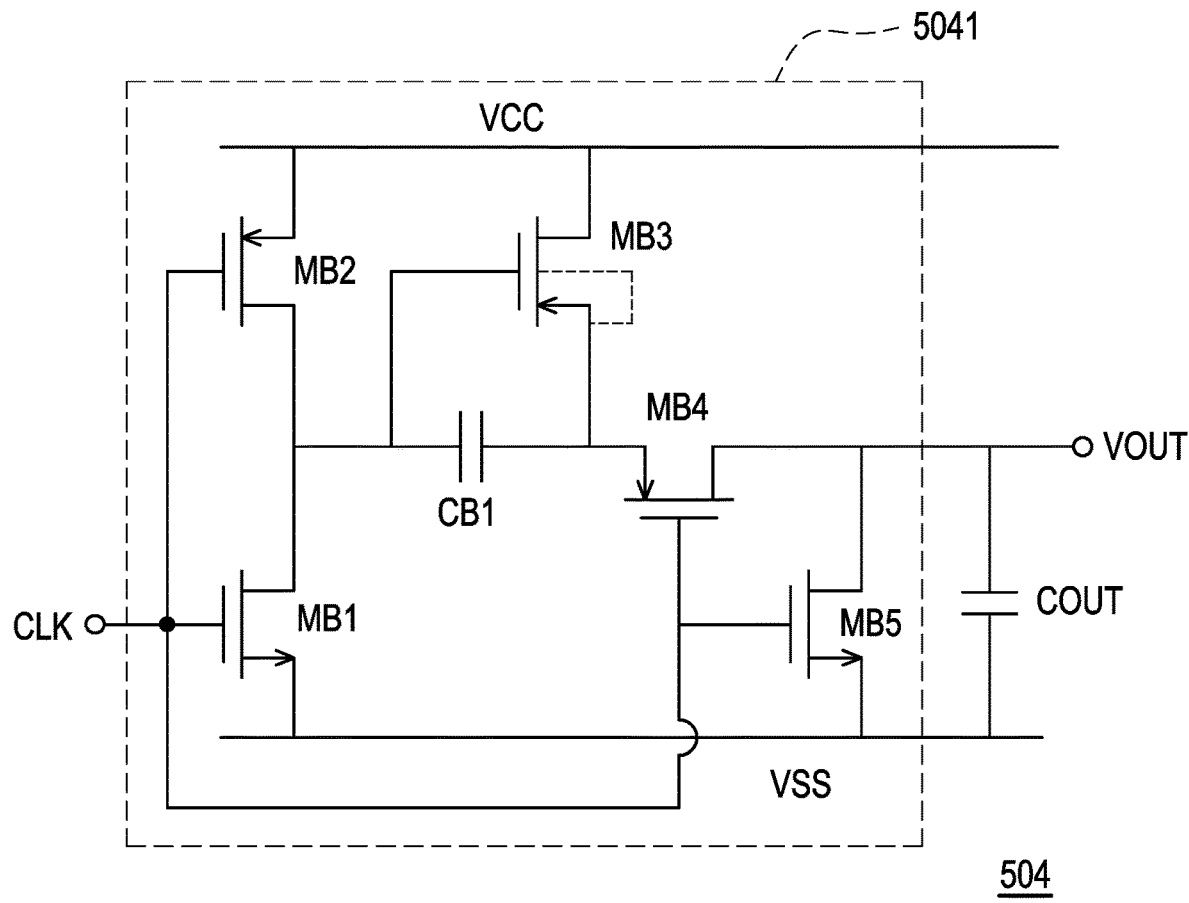

In FIG. 5E, the electronic device is a voltage booster 504. The voltage booster 504 includes a core circuit 5041 and a capacitor COUT, where the capacitor COUT is a capacitor string structure formed by a plurality of conductive plates forming a word line of a memory device. Detail of the capacitor string structure can be seen by the capacitor string structure 520 in FIG. 5A. The capacitor COUT is coupled to an output end of the core circuit 5041. The core circuit 5041 includes transistors MB1 to MB5 and a capacitor CB1. The transistors MB1 and MB2 form an inverting circuit for receiving a clock signal CLK and generating an inverted clock signal. The transistors MB3 to MB5 perform a plurality of switches and used to generate an output voltage VOUT by boosting a base voltage VCC.

It should be noted here, the capacitor string structure formed by a plurality of conductive plates forming a word line of a memory device also can be applied on any other circuit structures. FIG. 5A to FIG. 5E are exemplary examples only and not used to limit a scope of present disclosure.

Figure 6:
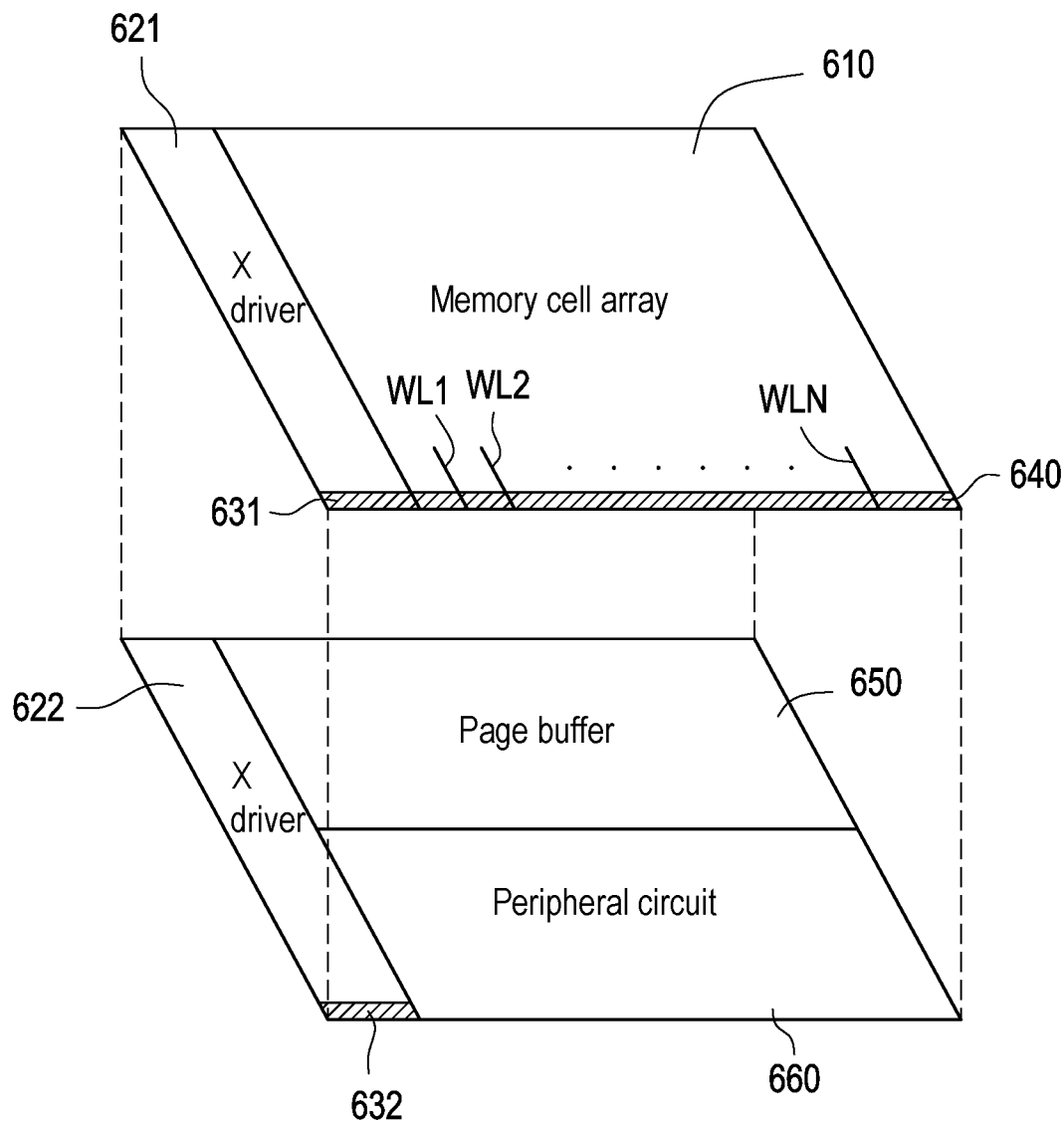
FIG. 6 is a schematic diagram of a memory device according to an embodiment of the disclosure.

Please refer to FIG. 6 for the following. FIG. 6 is a schematic diagram of a memory device according to an embodiment of the disclosure. The memory device 600 is a memory device with a three-dimensional structure. The memory device 600 includes a memory cell array 610, X drivers 621 to 622, charge pump circuits 631 to 632, a capacitor string structure 640, a page buffer 650, and a peripheral circuit 660. The memory cell array 610 may have a plurality of memory cells stacked in a three-dimensional manner. The X driver 621 may be disposed on one side of the memory cell array 610.

In addition, based on the layout direction of word lines WL1 to WLN in the memory cell array 610, the capacitor string structure 640 may be formed on the other side of the memory cell array 610. Corresponding to the position of the capacitor string structure 640, all or part components of the charge pump circuit 631 may be disposed adjacent to the capacitor string structure 640, and coupled to the capacitor string structure 640. In some embodiment, the charge pump circuit 631 may also be disposed under the memory cell array 610.

In the embodiment, the X drivers 621 to 622 may be stacked in a multi-layered manner in the memory device 600. Correspondingly, the charge pump circuits 631 to 632 may also be stacked in a multiple-layered manner in the memory device 600, and are disposed on the sides of the X drivers 621 to 622, respectively. In this way, the charge pump circuits 631 to 632 may not need to be disposed in the layout range of the peripheral circuit 660, and the requirement for layout area is effectively reduced.

Incidentally, the page buffer 650 and the peripheral circuit 660 in the embodiment may be disposed at the bottom of the memory device 600 and covered by the memory cell array 610. In addition, the X drivers 621 to 622, the page buffer 650, and the peripheral circuit 660 in the embodiment may all be implemented using a circuit architecture known to those of ordinary skill in the art, without fixed limitation.

The implementation details of the charge pump circuit 631 and the capacitor string structure 640 have been described in detail in the foregoing embodiments and implementations, and thus are not repeated here.

In summary, the disclosure uses the conductive plates forming the word lines in the memory device to form the capacitor string structure. Under the premise of not occupying additional layout area in the 3D memory device, the capacitor string structure is formed. In addition, the memory device and electronic devices of the disclosure may be combined with the above-mentioned capacitor string structure to be operated. In this way, the layout area of the memory device may be reduced, and the circuit cost may be reduced.

What is claimed is:

1. A capacitor string structure, comprising:
    a plurality of conductive plates disposed in a memory device, and the plurality of conductive plates stacked on each other and respectively forming a plurality of word lines in the memory device, wherein a capacitor is formed between two adjacent ones of the plurality of conductive plates,
    wherein among the plurality of conductive plates, a plurality of first conductive plates have a plurality of first protrusions overlapping each other, and a plurality of second conductive plates have a plurality of second protrusions overlapping each other, and the plurality of first protrusions and the plurality of second protrusions are non-overlapped.

2. The capacitor string structure according to claim 1, further comprising:
    a plurality of dielectric layers arranged alternately with the plurality of conductive plates, respectively.

3. The capacitor string structure according to claim 1, further comprising:
    a first transmission wire electrically connected to the plurality of first protrusions of the plurality of first conductive plates; and
    a second transmission wire electrically connected to the plurality of second protrusions of the plurality of second conductive plates.

4. The capacitor string structure according to claim 1, wherein the plurality of first conductive plates are not directly adjacent to each other, and the plurality of second conductive plates are not directly adjacent to each other.

5. The capacitor string structure according to claim 4, wherein at least one third conductive plate is further comprised between each of the plurality of first conductive plates and each of the plurality of second conductive plates.

6. An electronic device, comprising:
    a core circuit; and
    a plurality of first capacitors forming a capacitor string structure coupled to the core circuit, and the capacitor string structure formed by a plurality of conductive plates, and the plurality of conductive plates disposed in a memory device, stacked on each other, and respectively forming a plurality of word lines in the memory device, wherein each of the plurality of first capacitors is formed between two adjacent ones of the plurality of conductive plates,
    wherein among the plurality of conductive plates, a plurality of first conductive plates have a plurality of first protrusions overlapping each other, and a plurality of second conductive plates have a plurality of second protrusions overlapping each other, and the plurality of first protrusions and the plurality of second protrusions are non-overlapped.

7. The electronic device according to claim 6, wherein the capacitor string structure further comprises:
   a first transmission wire electrically connected to the plurality of first protrusions of the plurality of first conductive plates; and
   a second transmission wire electrically connected to the plurality of second protrusions of the plurality of second conductive plates.

8. The electronic device according to claim 6, wherein the plurality of first conductive plates are not directly adjacent, and the plurality of second conductive plates are not directly adjacent.

9. The electronic device according to claim 6, wherein the electronic device is a charge pump circuit, a voltage regulator, a voltage booster or a timing delay circuit.

10. A memory device, comprising:
    a plurality of word lines, and each of the plurality of word lines coupled to a plurality of memory cells, and the plurality of word lines respectively formed by a plurality of conductive plates, and the plurality of conductive plates forming a capacitor string structure; and
    a charge pump circuit coupled to the capacitor string structure, and performing a charge pump operation on a plurality of first capacitors in the capacitor structure according to a plurality of clock signals to generate an output voltage,
    wherein among the plurality of conductive plates, a plurality of first conductive plates have a plurality of first protrusions overlapping each other, and a plurality of second conductive plates have a plurality of second protrusions overlapping each other, and the plurality of first protrusions and the plurality of second protrusions do not overlap.

11. The memory device according to claim 10, wherein the capacitor string structure further comprises:
    a first transmission wire electrically connected to the plurality of first protrusions of the plurality of first conductive plates; and
    a second transmission wire electrically connected to the plurality of second protrusions of the plurality of second conductive plates.

12. The memory device according to claim 11, wherein the plurality of first conductive plates are not directly adjacent, and the plurality of second conductive plates are not directly adjacent.

13. The memory device according to claim 10, wherein the charge pump circuit comprises:
    a plurality of unit circuits, wherein the plurality of unit circuits are mutually connected in series, and each of the plurality of unit circuits is controlled by a second clock signal and a fourth clock signal, or controlled by a first clock signal and a third clock signal; and
    the plurality of first capacitors, wherein first terminals of each of the plurality of first capacitors receive the second clock signal, the third clock signal, or the reference ground voltage, and second terminals of each of the plurality of first capacitors are coupled to output terminals of each of the plurality of unit circuits correspondingly.

14. The memory device according to claim 13, wherein each of the plurality of unit circuits comprises:
    a first transistor having a first terminal that receives a reference voltage or is coupled to an output terminal of a unit circuit of the previous stage, and a control terminal of the first transistor coupled to output terminals of each of the plurality of unit circuits;
    a second transistor having a first terminal coupled to the first terminal of the first transistor, and a control terminal of the second transistor coupled to a second terminal of the first transistor, and a second terminal of the second transistor coupled to output terminals of each of the plurality of unit circuits; and
    a second capacitor having a first terminal that receives the fourth clock signal, and a second terminal of the second capacitor coupled to the control terminal of the second transistor.

15. The memory device according to claim 14, further comprising:
    a memory cell array having the plurality of memory cells stacked in a three-dimensional manner; and
    a driver adjacently disposed on a first side of the memory cell array, wherein
    the charge pump circuit is disposed under the memory cell array and coupled to the capacitor string structure.

* * * * *